(12) United States Patent
Suzuki

(10) Patent No.: US 6,713,794 B2
(45) Date of Patent: Mar. 30, 2004

(54) LATERAL SEMICONDUCTOR DEVICE

(75) Inventor: Fumito Suzuki, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 189 days.

(21) Appl. No.: 09/897,058

(22) Filed: Jul. 3, 2001

(65) Prior Publication Data

US 2002/0005559 A1 Jan. 17, 2002

(30) Foreign Application Priority Data

Jul. 4, 2000 (JP) ........................................ 2000-202341

(51) Int. Cl.[7] .................... H01L 29/76; H01L 29/94; H01L 31/062; H01L 31/113; H01L 31/119
(52) U.S. Cl. ...................................................... 257/288
(58) Field of Search ................................. 257/370, 371, 257/372, 378, 492, 491, 493, 495, 496, 344, 345, 346, 367, 404, 349, 350, 138, 347, 341

(56) References Cited

U.S. PATENT DOCUMENTS

| 4,520,382 | A | * | 5/1985 | Shimura | 357/53 |
| 5,559,348 | A |   | 9/1996 | Watabe et al. | |
| 5,731,617 | A | * | 3/1998 | Suda | 257/370 |
| 5,869,850 | A |   | 2/1999 | Endo et al. | |
| 5,981,983 | A | * | 11/1999 | Funaki et al. | 257/138 |
| 6,218,709 | B1 | * | 4/2001 | Yasuda | 257/378 |
| 6,265,752 | B1 | * | 7/2001 | Liu et al. | 257/487 |
| 6,392,275 | B1 |   | 5/2002 | Jang | |

FOREIGN PATENT DOCUMENTS

| JP | 406151728 A | * | 5/1994 |
| JP | 406232351 A | * | 8/1994 |
| KR | 1020000033197 |   | 6/2000 |

* cited by examiner

Primary Examiner—Long Pham
Assistant Examiner—Dana Farahani
(74) Attorney, Agent, or Firm—Oblon, Spivak, McClelland, Maier & Neustadt, P.C.

(57) ABSTRACT

A semiconductor device including a semiconductor base, a first semiconductor region formed in the semiconductor base, a second semiconductor region formed in the semiconductor base, a third semiconductor region formed in the first semiconductor region, a first main electrode which is formed on the first and third semiconductor regions, a second main electrode which is formed on the second semiconductor region, an insulating film formed on the semiconductor base and first semiconductor region, and a gate electrode formed on the insulating film. The fourth semiconductor region is formed in the semiconductor base between the first and second semiconductor regions below an end region of the gate electrode.

14 Claims, 8 Drawing Sheets

LATERAL SEMICONDUCTOR DEVICE

CROSS-REFERENCE TO RELATED APPLICATIONS

This application is based upon and claims the benefit of priority from the prior Japanese Patent Applications No. 2000-202341, filed Jul. 4, 2000, the entire contents of which are incorporated herein by reference.

BACKGROUND OF THE INVENTION

The present invention relates to an increase in the ruggedness of a lateral semiconductor device such as a lateral IGBT.

FIG. 1 is a sectional view showing a conventional lateral IGBT.

As shown in FIG. 1, an isolated N$^-$-type island region 102 is formed on a dielectric isolation substrate, e.g., SOI substrate 101. A P-type base layer 103 and N-type buffer layer 104 are formed apart from each other in the N$^-$-type island region 102. An N$^+$-type source layer 105 is formed in the P-type base layer 103, and a P$^+$-type base contact layer 106 is formed in the N$^+$-type source layer 105 so as to reach the P-type base layer 103. A source electrode (source wiring layer; which may also be called an emitter electrode or emitter wiring layer) 107 is electrically connected to the P-type base layer 103 via the P$^+$-type base contact layer 106, and to the N$^+$-type source layer 105. A P$^+$-type drain layer 108 is formed in the N-type buffer layer 104. A drain electrode (drain wiring layer; which may also be called a collector electrode or collector wiring layer) 109 is electrically connected to the P$^+$-type drain layer 108. A portion of the P-type base layer 103 that is sandwiched between the N$^-$-type island region 102 and the N$^+$-type source layer 105 functions as the channel of a MOS transistor. A gate electrode 110 is formed from the channel to the N$^-$-type island region 102 via a gate oxide film 111.

A summary of the operation of the lateral IGBT is as follows.

For example, the drain electrode 109 is set to a high potential, whereas the source electrode 107 is set to a low potential. If the gate electrode 110 changes to "HIGH" level in this state, the conductivity type of the channel is reversed, and electrons are injected from the N$^+$-type source layer 105 to the N$^-$-type island region 102 via the channel, as indicated by an arrow 112. As a result, a PNP bipolar transistor having the N-type buffer layer 104 and N$^-$-type island region 102 as a base, the P$^+$-type drain layer 108 as a collector, and the P-type base layer 103 as an emitter is turned on. Then, the lateral IGBT is turned "on".

If the gate electrode 110 changes to a "LOW" level, the conductivity type of the channel returns to the original one, injection of electrons into the N$^-$-type island region 102 stops, and the PNP bipolar transistor is turned off. Thus, the lateral IGBT is turned "off".

The gate electrode 110 is formed above the surface (major surface) of the N$^-$-type island region 102 via the gate oxide film 111. A strong electric field is generated in an end region 113 of the gate electrode 110.

In the lateral IGBT, electrons concentratedly flow through the surface (major surface) of the N$^-$-type island region 102, as indicated by the arrow 112. In other words, electrons concentratedly flow immediately below the gate electrode 110. Consequently, a current concentrates immediately below the end region 113, readily causing a breakdown around the end region 113. This inhibits an increase in ruggedness.

BRIEF SUMMARY OF THE INVENTION

A semiconductor device according to an aspect of the invention comprises: a semiconductor base of a first conductivity type having a major surface; a first semiconductor region of a second conductivity type formed in the semiconductor base; a second semiconductor region formed in the semiconductor base, the second semiconductor region separate from the first semiconductor region; a third semiconductor region of the first conductivity type formed in the first semiconductor region; a first main electrode which is formed on the major surface of the semiconductor base and electrically connected to the first and third semiconductor regions; a second main electrode which is formed on the major surface of the semiconductor base and electrically connected to the second semiconductor region; an insulating film formed on the major surface of the semiconductor base; a gate electrode formed on the insulating film at least on the major surface of the semiconductor base and the first semiconductor region between the semiconductor base and the third semiconductor region; and a fourth semiconductor region of the second conductivity type formed in the semiconductor base between the first and second semiconductor regions below an end region of the gate electrode.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Figure 1:
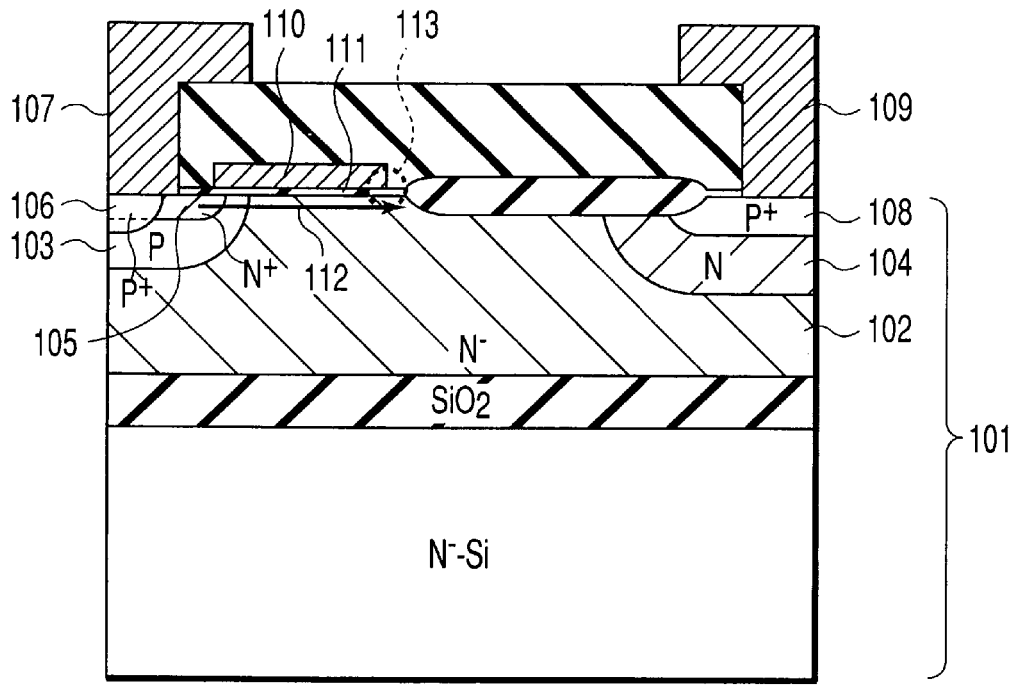
FIG. 1 is a cross-sectional view showing a conventional lateral IGBT in dielectric isolation substrate.

Preferred embodiments of the present invention will be described below with reference to the several views of the accompanying drawing. In the following description, the same reference numerals denote the same parts throughout the several views of the accompanying drawings.

(First Embodiment)

Figure 2:
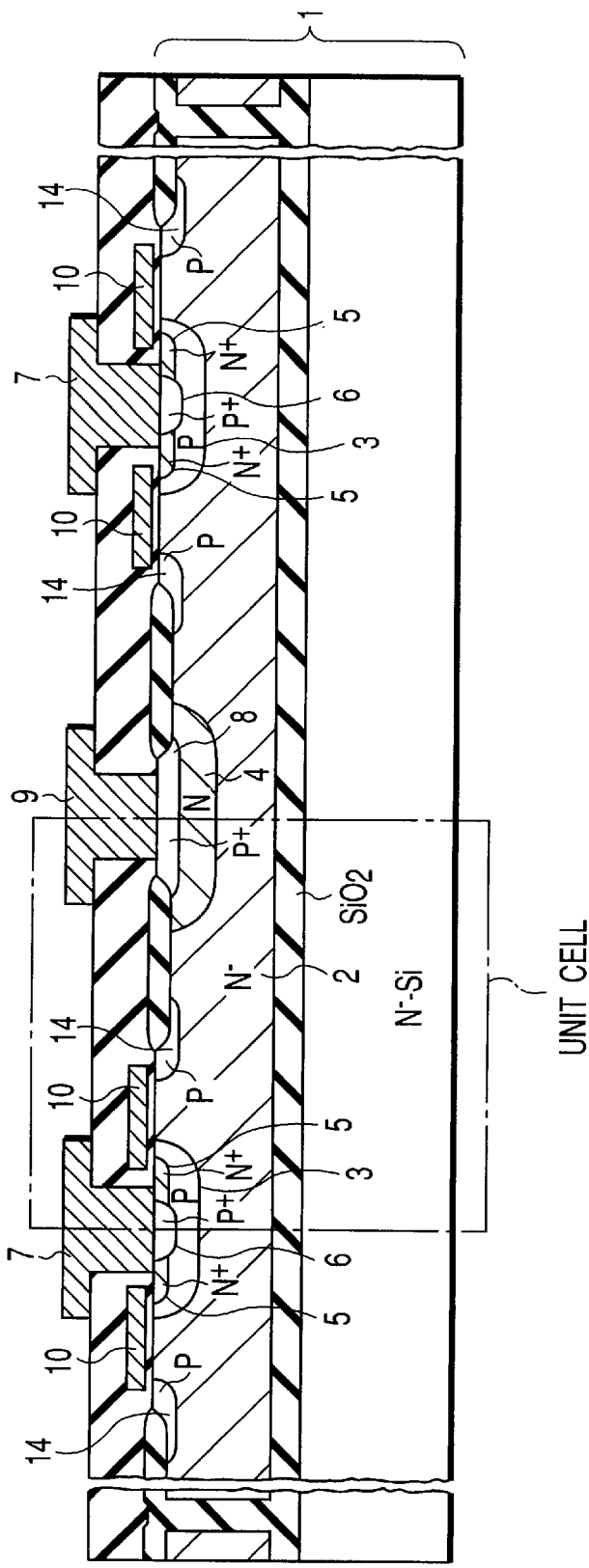
FIG. 2 is a cross-sectional view showing a lateral IGBT in dielectric isolation substrate according to the first embodiment of the present invention.

FIG. 2 is a cross-sectional view showing a lateral insulated-gate bipolar transistor (IGBT) in dielectric isolation substrate according to the first embodiment of the present invention.

Figure 3:
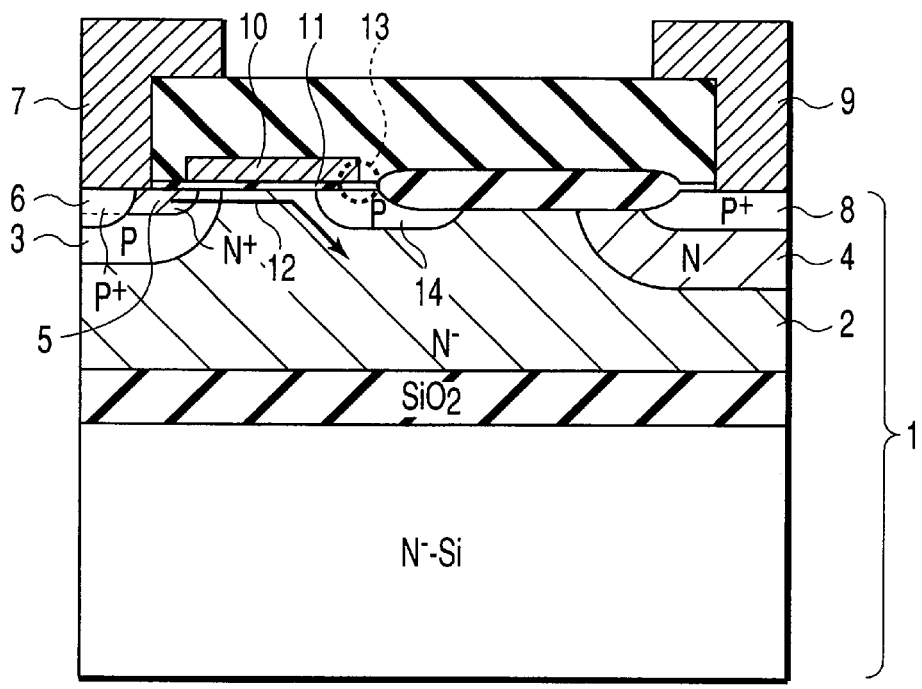
FIG. 3 is an enlarged view showing a structure within the frame of a chain line in FIG. 2.

As shown in FIG. 2, the lateral IGBT is formed in an N$^-$-type island region 2 isolated from a dielectric isolation substrate, e.g., SOI substrate 1. The lateral IGBT is constituted by repetitively forming basic structures (to be referred to as unit cells hereinafter) each surrounded by the frame of a dotted line in FIG. 2. FIG. 3 is an enlarged view showing the structure (one unit cell) within the frame of the chain line in FIG. 2. Several embodiments of the present invention will be described by focusing on one unit cell.

As shown in FIG. 3, a P-type base layer 3 and N-type buffer layer 4 are formed apart from each other in a semiconductor base, i.e., N⁻-type island region 2 where a semiconductor element is formed. An N⁺-type source layer 5 is formed in the P-type base layer 3, and a P⁺-type base contact layer 6 is formed in the N⁺-type source layer 5 so as to reach the P-type base layer 3. A source electrode (source wiring layer; which may also be called an emitter electrode or emitter wiring layer) 7 is electrically connected to the P-type base layer 3 via the P⁺-type base contact layer 6, and to the N⁺-type source layer 5. A P⁺-type drain layer 8 is formed in the N-type buffer layer 4. A drain electrode (drain wiring layer; which may also be called a collector electrode or collector wiring layer) 9 is electrically connected to the P⁺-type drain layer 8. A portion of the P-type base layer 3 that is sandwiched between the N⁻-type island region 2 and the N⁺-type source layer 5 functions as the channel of a MOS transistor. A gate electrode 10 is formed from the channel to the N⁻-type island region 2 via a gate oxide film 11.

In the lateral IGBT according to the first embodiment, a P-type diffusion layer 14 is formed, e.g., in the N⁻-type island region 2 immediately below a drain-side end region 13 of the gate electrode 10. The P-type diffusion layer 14 electrically floats.

An example of the operation will be described.

For example, the drain electrode 9 is set to a high potential, whereas the source electrode 7 is set to a low potential. If the gate electrode 10 changes to a "HIGH" level in this state, the conductivity type of the channel is reversed, and electrons are injected from the N⁺-type source layer 5 to the N⁻-type island region 2 via the channel, as indicated by an arrow 12. As a result, a PNP bipolar transistor having the N-type buffer layer 4 and N⁻-type island region 2 as a base, the P⁺-type drain layer 8 as a collector, and the P-type base layer 3 as an emitter is turned on. Then, the lateral IGBT is turned "on".

If the gate electrode 10 changes to a "LOW" level, the conductivity type of the channel returns to the original one, injection of electrons into the N⁻-type island region 2 stops, and the PNP bipolar transistor is turned off. Thus, the lateral IGBT is turned "off".

An example of the manufacturing method will be explained.

FIGS. 4A to 4I are sectional views, respectively, showing the main steps in manufacturing the lateral IGBT according to the first embodiment.

Figure 4A:
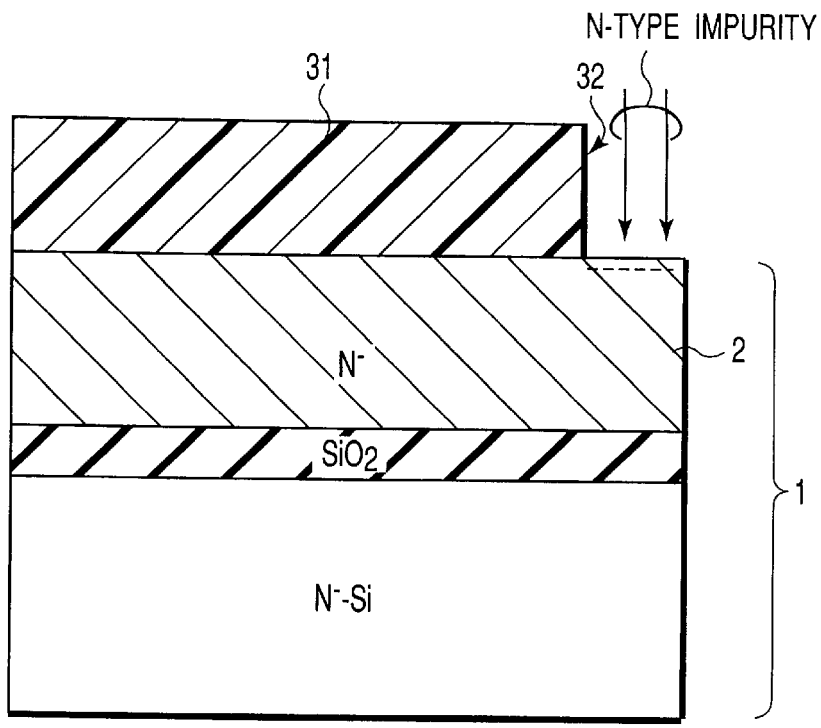
FIGS. 4A, 4B, 4C, 4D, 4E, 4F, 4G, 4H, and 4I are cross-sectional views, respectively, showing the steps in manufacturing the lateral IGBT in dielectric isolation substrate according to the first embodiment of the present invention.

As shown in FIG. 4A, a photoresist film 31 having a window 32 corresponding to an N-type buffer layer formation region is formed in the N⁻-type island region 2. An N-type impurity is ion-implanted into the N⁻-type island region 2 via the window 32.

Figure 4B:
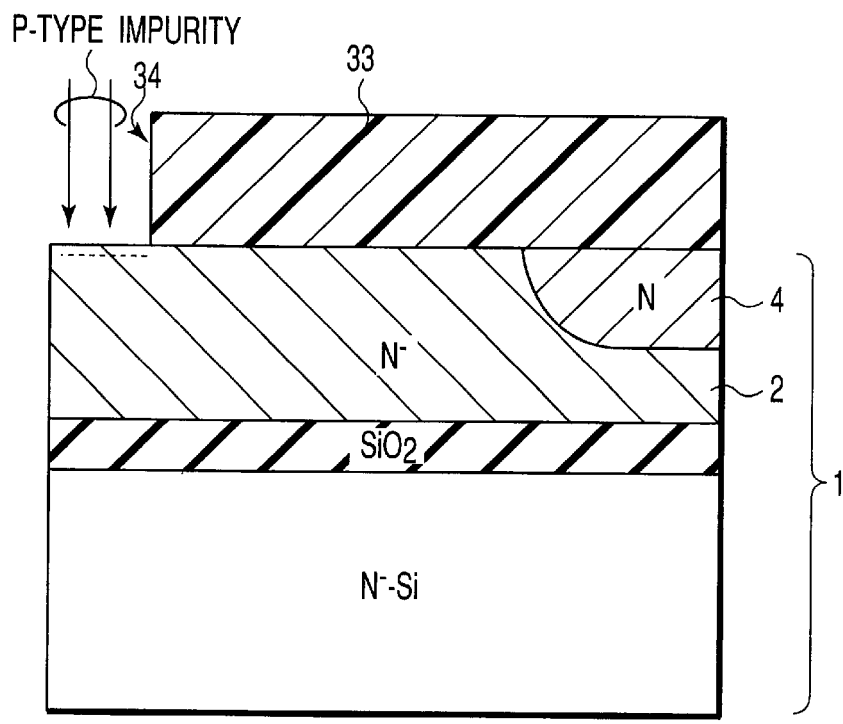

As shown in FIG. 4B, the photoresist film 31 is removed, and the SOI substrate 1 is annealed to diffuse the implanted N-type impurity, thereby forming an N-type buffer layer 4. A photoresist film 33 having a window 34 corresponding to a P-type base layer formation region is formed in the N⁻-type island region 2. A P-type impurity is ion-implanted into the N⁻-type island region 2 via the window 34.

Figure 4C:
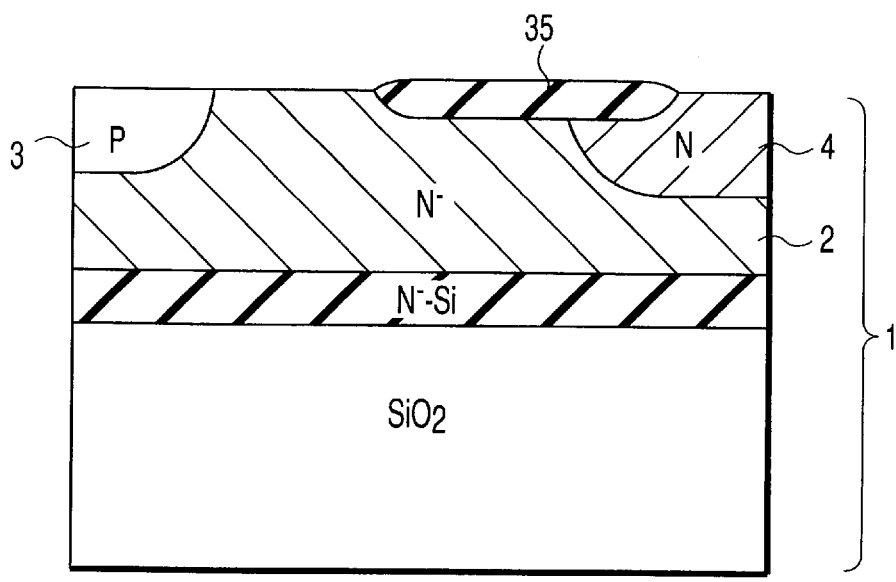

As shown in FIG. 4C, the photoresist film 33 is removed, and the SOI substrate 1 is annealed to diffuse the implanted P-type impurity, thereby forming a P-type base layer 3. A field oxide film 35 is formed in the N⁻-type island region 2 by, e.g., LOCOS.

Figure 4D:
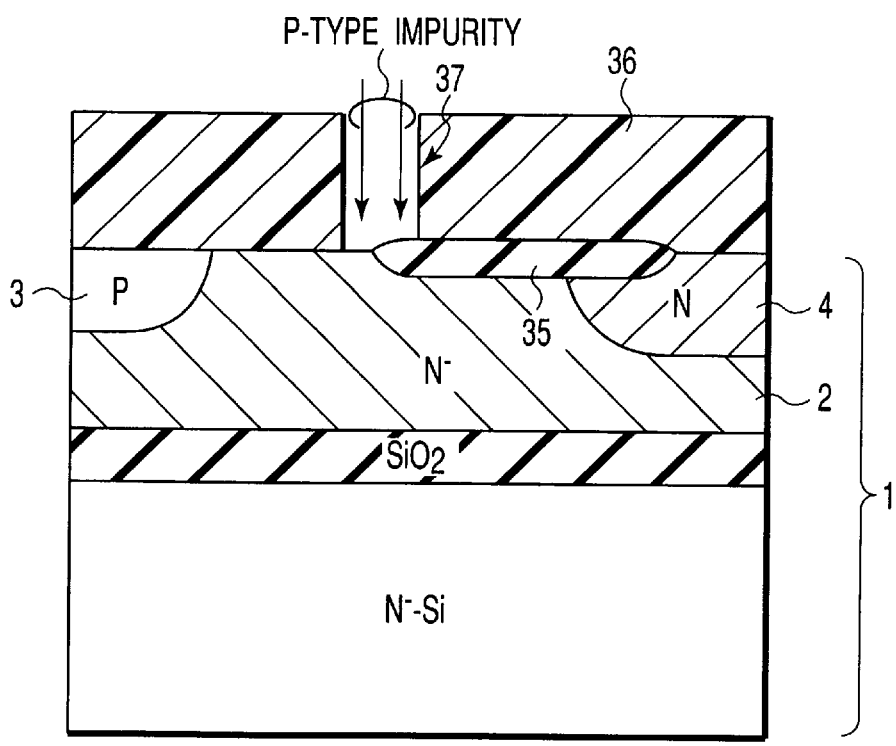

As shown in FIG. 4D, a photoresist film 36 having a window 37 corresponding to a P-type diffusion layer formation region is formed in the N⁻-type island region 2 where the field oxide film 35 is formed. A P-type impurity is ion-implanted into the N⁻-type island region 2 via the window 37.

Figure 4E:
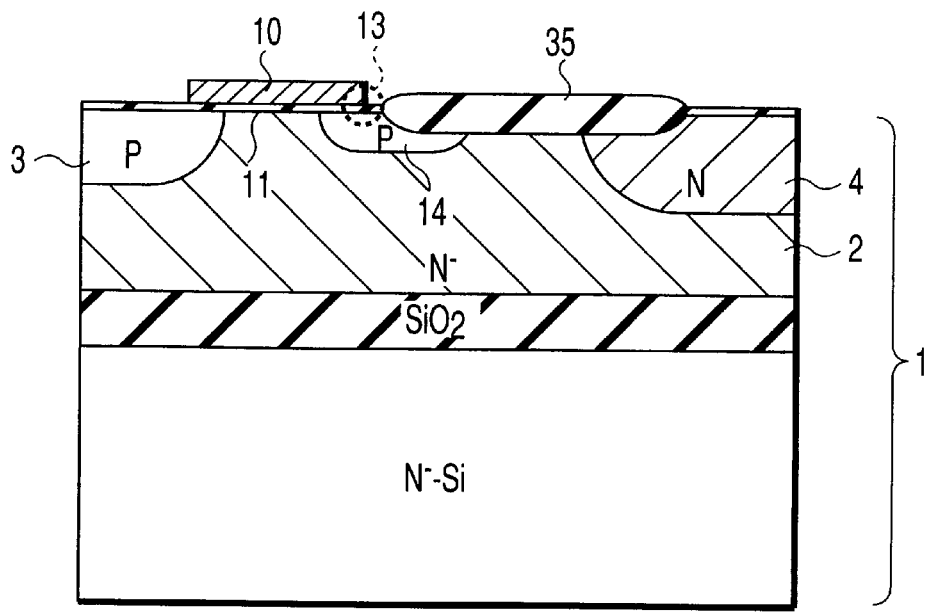

As shown in FIG. 4E, the photoresist film 36 is removed, and the SOI substrate 1 is annealed to diffuse the implanted P-type impurity, thereby forming a P-type diffusion layer 14. The SOI substrate 1 is thermally oxidized to form a gate oxide film 11. Conductive silicon is deposited in the N⁻-type island region 2 where the gate oxide film 11 and field oxide film 35 are formed, thus forming a conductive polysilicon film. The conductive polysilicon film is patterned to form a gate electrode 10. At this time, the gate electrode 10 is so patterned as to position its drain-side end region 13 on the P-type diffusion layer 14.

Figure 4F:
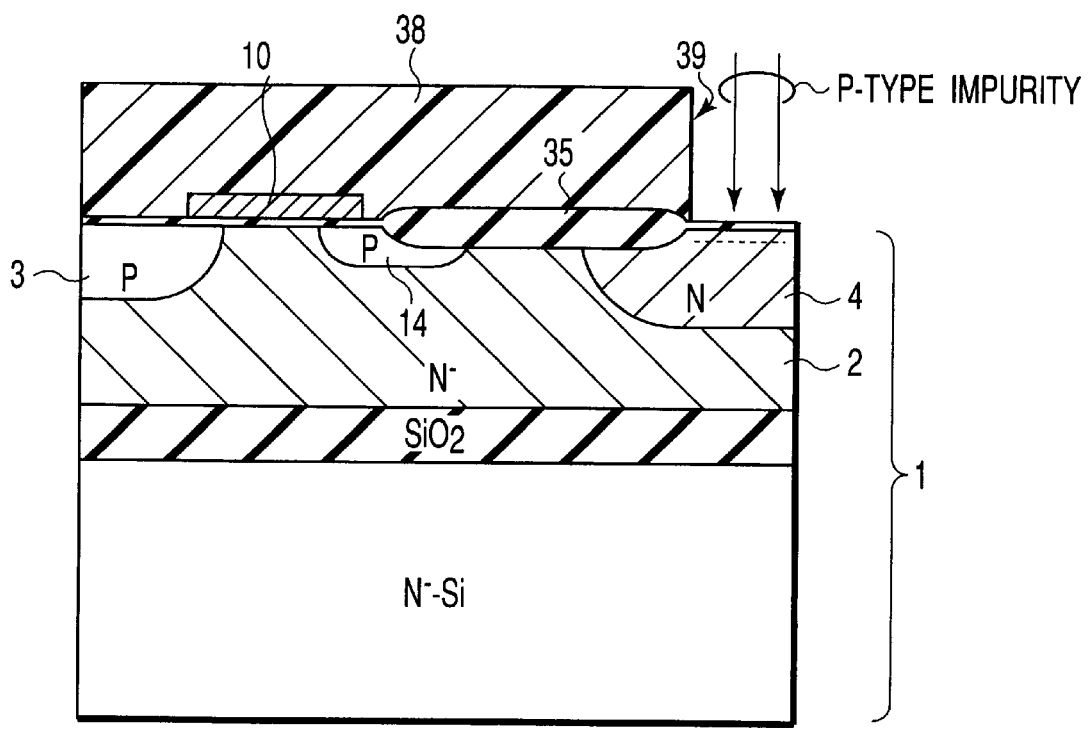

As shown in FIG. 4F, a photoresist film 38 having a window 39 corresponding to a P⁺-type drain layer formation region is formed in the N⁻-type island region 2. A P-type impurity is ion-implanted into the N-type buffer layer 4 via the window 39.

Figure 4G:
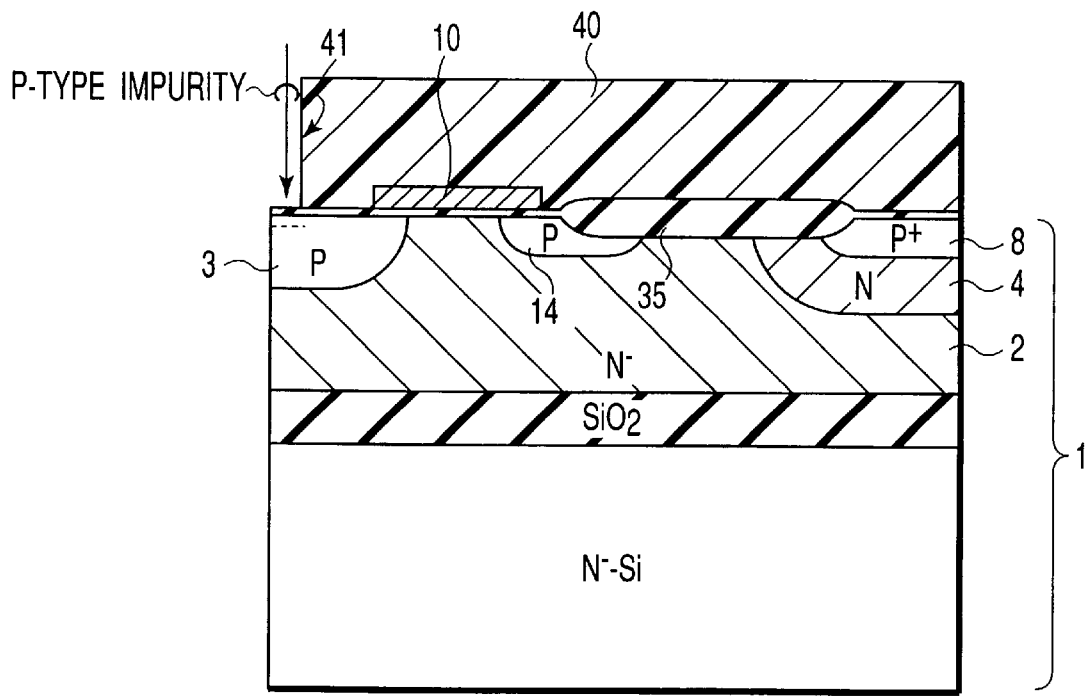

As shown in FIG. 4G, the photoresist film 38 is removed, and the SOI substrate 1 is annealed to diffuse the implanted P-type impurity, thereby forming a P⁺-type drain layer 8. A photoresist film 40 having a window 41 corresponding to a P⁺-type contact layer formation region is formed in the N⁻-type island region 2. A P-type impurity is ion-implanted into the P-type base layer 3 via the window 41.

Figure 4H:
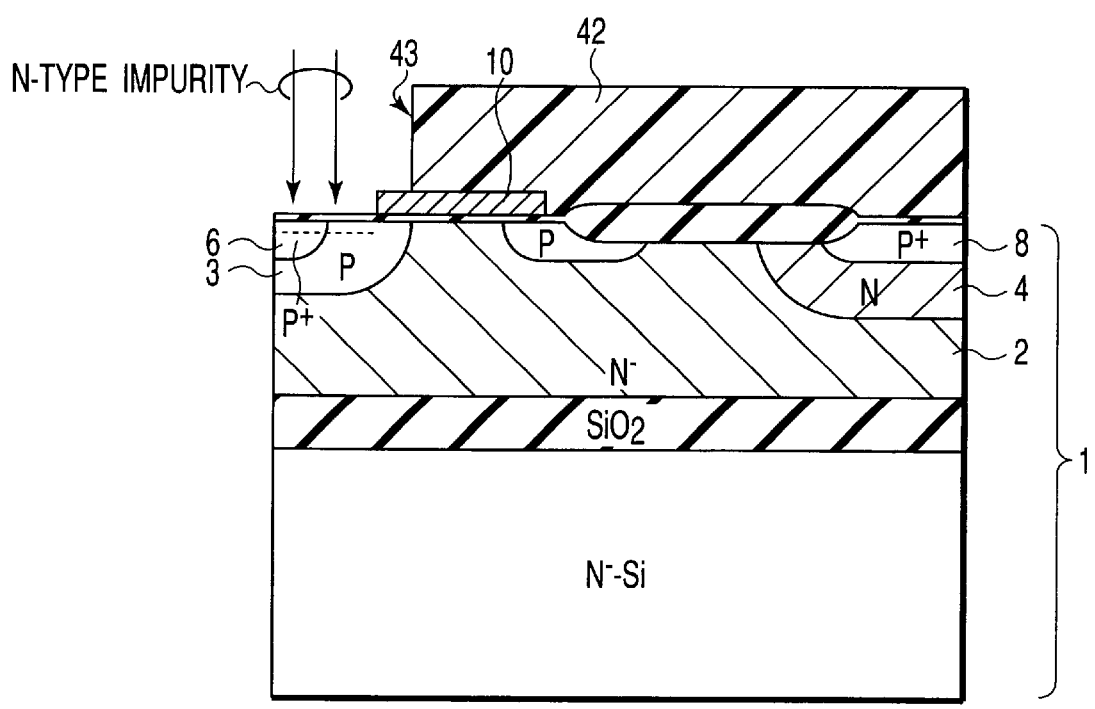

As shown in FIG. 4H, the photoresist film 40 is removed, and the SOI substrate 1 is annealed to diffuse the implanted P-type impurity, thereby forming a P⁺-type contact layer 6. A photoresist film 42 having a window 43 corresponding to an N⁺-type source layer formation region is formed in the N⁻-type island region 2. An N-type impurity is ion-implanted into the P-type base layer 3 and P⁺-type contact layer 6 via the window 43.

Figure 4I:
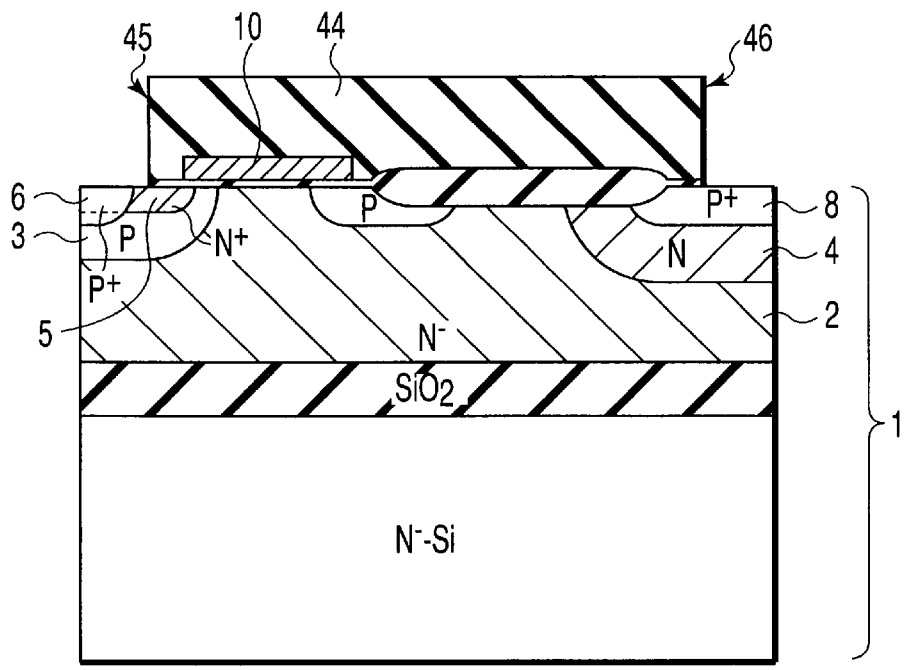

As shown in FIG. 4I, the photoresist film 42 is removed, and the SOI substrate 1 is annealed to diffuse the implanted N-type impurity, thereby forming an N⁺-type source layer 5. For example, silicon oxide is deposited in the N⁻-type island region 2 to form an interlevel insulating film 44. A source contact hole 45 which reaches the N⁺-type source layer 5 and P⁺-type contact layer 6, a drain contact hole 46 which reaches the P⁺-type drain layer 8, and a gate contact hole (not shown) which reaches the gate electrode 10 are formed in the interlevel insulating film 44 by photolithography.

As shown in FIG. 3, e.g., aluminum is sputtered onto the structure shown in FIG. 4I to form an aluminum film. The aluminum film is patterned to form a source electrode (or source wiring layer) 7, drain electrode (or drain wiring layer) 9, and gate wiring layer (not shown).

In this way, the lateral IGBT according to the first embodiment is completed.

This lateral IGBT has the P-type diffusion layer 14 formed in the N⁻-type island region 2 immediately below the drain-side end region 13 of the gate electrode 10. The P-type diffusion layer 14 makes electrons concentratedly flowing through the surface (major surface) of the N⁻-type island region 2 dispersively flow along the P-N junction between the P-type diffusion layer 14 and the N⁻-type island region 2. As a result, the concentration of current is relaxed immediately below the drain-side end region 13 where a current readily concentrates in the prior art, thus suppressing a dielectric breakdown around the end region 13. The lateral IGBT can attain high ruggedness.

(Second Embodiment)

Figure 5:
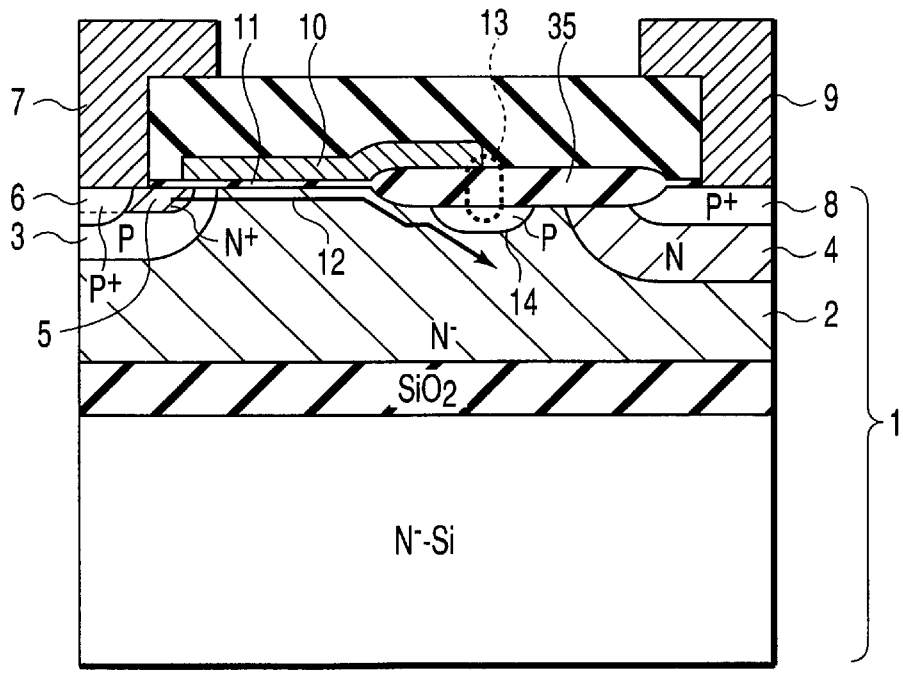
FIG. 5 is a cross-sectional view showing a lateral IGBT in dielectric isolation substrate according to the second embodiment of the present invention.

FIG. 5 is a cross-sectional view showing a lateral insulated-gate bipolar transistor (IGBT) in dielectric isolation substrate according to the second embodiment of the present invention.

As shown in FIG. 5, the second embodiment is different from the first embodiment in that a drain-side end region 13 is formed not on a gate oxide film 11 but on a field oxide film 35.

Even when the drain-side end region 13 is formed on the field oxide film 35, a P-type diffusion layer 14 can be formed in an N⁻-type island region 2 immediately below the drain-side end region 13 to relax the concentration of current immediately below the drain-side end region 13 and suppress a breakdown around the end region 13. Similar to the first embodiment, the breakdown resistance can be increased.

(Third Embodiment)

Figure 6:
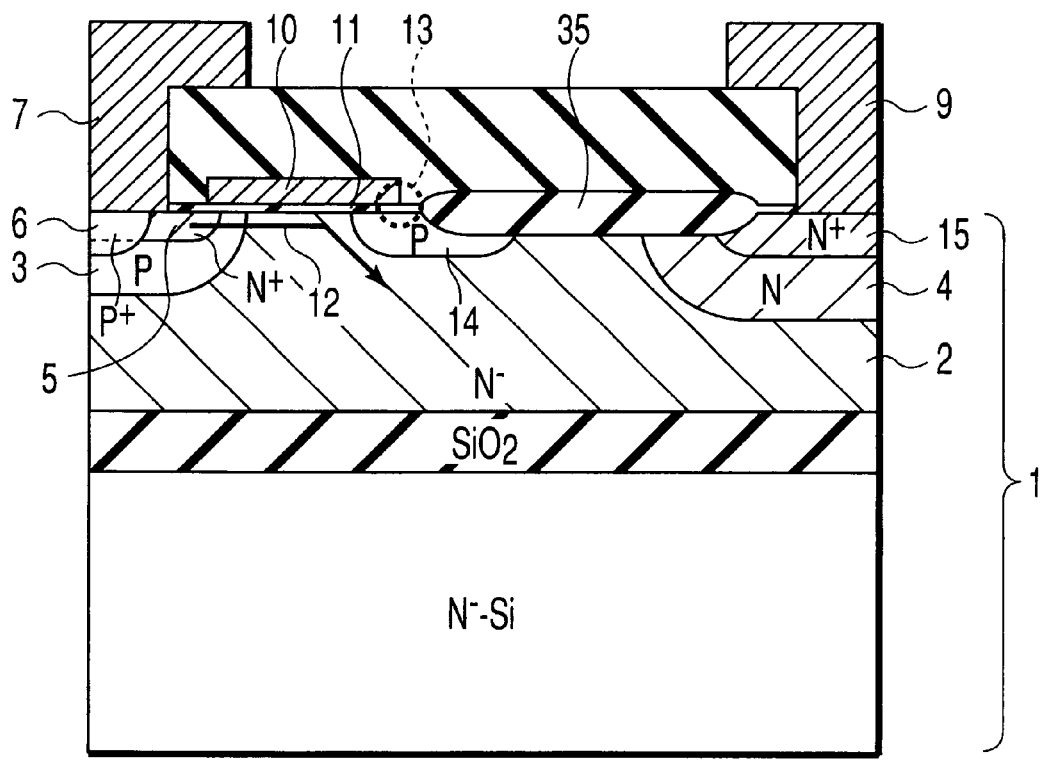
FIG. 6 is a cross-sectional view showing a lateral MOSFET in dielectric isolation substrate according to the third embodiment of the present invention.

FIG. 6 is a cross-sectional view showing a lateral MOSFET in dielectric isolation substrate according to the third embodiment of the present invention.

As shown in FIG. 6, the third embodiment is different from the first embodiment in that an N⁺-type drain layer 15 is formed in an N-type buffer layer 4 in place of a P⁺-type drain layer 8. That is, the third embodiment concerns not a lateral IGBT but a lateral MOSFET (lateral double-diffused MOSFET).

An example of the operation will be described.

For example, a drain electrode 9 is set to a high potential, whereas a source electrode 7 is set to a low potential. If a gate electrode 10 changes to a "HIGH" level in this state, the conductivity type of the channel is reversed, and an N⁺-type source layer 5 and N⁻-type island region 2 are electrically connected to each other. Then, electrons flow from the N⁺-type source layer 5 to the N⁻-type island region 2 to turn on a MOSFET having the N⁻-type island region 2, N-type buffer layer 4, and N⁺-type drain layer 15 as a drain, a P-type base layer 3 as a back gate, and the N⁺-type source layer 5 as a source. The lateral MOSFET is turned "on".

If the gate electrode 10 changes to a "LOW" level, the conductivity type of the channel returns to the original one, the N⁺-type source layer 5 and N⁻-type island region 2 are electrically disconnected, the MOSFET is turned off, and the lateral MOSFET is turned "off".

The present invention can be applied not only to a lateral IGBT but also to a lateral MOSFET. The present invention can be applied with the same effects to a lateral semiconductor device in which a current flows, not in the direction of depth of a semiconductor base where elements are formed, but in the plane direction, e.g., along the surface (major surface) of the N⁻-type island region 2.

The present invention has been described by the first to third embodiments, but is not limited to them. In implementing the present invention, the present invention can be variously modified within the spirit and scope of the invention.

For example, the N-type buffer layer 4 is formed to achieve one object of suppressing extension of a depletion layer in, e.g., the N⁻-type island region 2 and increasing the ruggedness of the source-drain path. The N-type buffer layer 4 is formed as needed; it can be omitted if it is unnecessary.

The P-type base layer 3 is formed to allow the aluminum source electrode 7 to make ohmic contact with the silicon P-type base layer 3. The P-type base layer 3 is formed as needed; it can be omitted if it is unnecessary, similar to the N-type buffer layer 4.

The above embodiments have exemplified the operation when the drain electrode 9 is set to a high potential and the source electrode 7 is set to a low potential. If necessary, the drain electrode 9 may be set to a low potential and the source electrode 7 may be set to a high potential.

The respective embodiments can be not only singly practiced, but also appropriately combined and practiced.

These embodiments include various stages of the present invention, and various stages of the present invention can also be extracted by properly combining a plurality of constituting elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor base of a first conductivity type having a major surface;
   a first semiconductor region of a second conductivity type formed in the semiconductor base;
   a second semiconductor region of the second conductivity type formed in the semiconductor base, the second semiconductor region separate from the first semiconductor region;
   a third semiconductor region of the first conductivity type formed in the first semiconductor region;
   a first main electrode which is formed on the major surface of the semiconductor base and electrically connected to the first and third semiconductor regions;
   a second main electrode which is formed on the major surface of said semiconductor base and electrically connected to the second semiconductor region;
   an insulating film formed on the major surface of the semiconductor base;
   a gate electrode formed on said insulating film at least on the major surface of the semiconductor base and the first semiconductor region between the semiconductor base and the third semiconductor region; and
   a fourth semiconductor region of the second conductivity type formed in the semiconductor base between the first and second semiconductor regions below an end region of the gate electrode,
   wherein the semiconductor device includes a lateral insulated-gate bipolar transistor having the semiconductor base as a base, the second semiconductor region as a collector, and the third semiconductor region as an emitter.

2. The device according to claim 1, wherein the insulating film has a gate insulating film portion and a field insulating film portion thicker than the gate insulating film portion, and the end region of the gate electrode is formed at the gate insulating film portion.

3. The device according to claim 1, wherein the insulating film has a gate insulating film portion and a field insulating film portion thicker than the gate insulating film portion, and the end region of the gate electrode is formed at the field insulating film portion.

4. The device according to claim 1, wherein the semiconductor base includes an island region formed in a dielectric isolation substrate.

5. The device according to claim 2, wherein the semiconductor base includes an island region formed in a dielectric isolation substrate.

6. The device according to claim 3, wherein the semiconductor base includes an island region formed in a dielectric isolation substrate.

7. A semiconductor device comprising:
   a semiconductor base of a first conductivity type having a major surface;
   a first semiconductor region of a second conductivity type formed in the semiconductor base;
   a second semiconductor region of the first conductivity type formed in the semiconductor base, the second semiconductor region separate from the first semiconductor region;
   a third semiconductor region of the first conductivity type formed in the first semiconductor region;
   a first main electrode which is formed on the major surface of the semiconductor base and electrically connected to the first and second semiconductor regions;
   a second main electrode which is formed on the major surface of the semiconductor base and electrically connected to the second semiconductor region; an insulating film formed on the major surface of the semiconductor base;
   a gate electrode formed on the insulating film at least on the major surface of the semiconductor base and the first semiconductor region between the semiconductor base and the third semiconductor region; and
   a fourth semiconductor region of the second conductivity type formed in the semiconductor base between the first and third semiconductor regions below an end region of the gate electrode,
   wherein the semiconductor device includes a lateral MOSFET having the semiconductor base and the second semiconductor region as a drain, the first semiconductor region as a back gate, and the third semiconductor region as a source.

8. The device according to claim 7, wherein the insulating film has a gate insulating film portion and a field insulating film portion thicker than the gate insulating film portion, and the end region of the gate electrode is formed at the gate insulating film portion.

9. The device according to claim 7, wherein the insulating film has a gate insulating film portion and a field insulating film portion thicker than the gate insulating film portion, and the end region of the gate electrode is formed at the field insulating film portion.

10. The device according to claim 7, wherein the semiconductor base includes an island region formed in a dielectric isolation substrate.

11. The device according to claim 8, wherein the semiconductor base includes an island region formed in a dielectric isolation substrate.

12. The device according to claim 9, wherein the semiconductor base includes an island region formed in a dielectric isolation substrate.

13. The device according to claim 1, wherein the fourth semiconductor region is electrically floating.

14. The device according to claim 7, wherein the fourth semiconductor region is electrically floating.

* * * * *